United States Patent [19]
Burk, Jr. et al.

[11] Patent Number: 5,501,173
[45] Date of Patent: Mar. 26, 1996

[54] METHOD FOR EPITAXIALLY GROWING α-SILICON CARBIDE ON A-AXIS α-SILICON CARBIDE SUBSTRATES

[75] Inventors: Albert A. Burk, Jr., Murrysville; Donovan L. Barrett, Penn Hills Township, Allegheny County; Hudson M. Hobgood, Murrysville; Rowland C. Clarke, Bell Township, Westmoreland County; Graeme W. Eldridge, Murrysville; Charles D. Brandt, Mt. Lebanon, all of Pa.

[73] Assignee: Westinghouse Electric Corporation, Pittsburgh, Pa.

[21] Appl. No.: 138,564

[22] Filed: Oct. 18, 1993

[51] Int. Cl.$^6$ .......................... C30B 25/20; H01L 21/205
[52] U.S. Cl. .............................. 117/84; 117/101; 117/951; 437/100; 148/DIG. 148
[58] Field of Search .................. 437/100; 117/84, 117/951, 101; 148/DIG. 148

[56] References Cited

U.S. PATENT DOCUMENTS

| | | | |
|---|---|---|---|
| 3,956,032 | 5/1976 | Powell et al. | 148/175 |
| 4,762,806 | 8/1988 | Suzuki et al. | 437/100 |
| 4,897,149 | 1/1990 | Suzuki et al. | 156/610 |
| 4,912,064 | 3/1990 | Kong et al. | 437/100 |
| 4,966,860 | 10/1990 | Suzuki et al. | 437/31 |
| 5,011,549 | 4/1991 | Kong et al. | 148/33.1 |
| 5,225,032 | 7/1993 | Golecki | 437/100 |
| 5,238,866 | 8/1993 | Bolz et al. | 437/100 |

FOREIGN PATENT DOCUMENTS

| | | | |
|---|---|---|---|
| 62-36813 | 2/1987 | Japan | 437/100 |
| 2-213141 | 8/1990 | Japan | 437/100 |

OTHER PUBLICATIONS

Yoshida et al., "A New Doping Method Using Metalorganics in Chemical Vapor Deposition of 6H–SiC", J. Appl. Phys. vol. 55, No. 1, 1 Jan. 1984, pp. 169–171.

Harris et al., "Growth Characteristics of αSilicon Carbide I Chemical Vapor Deposition", Chem. Vapor Deposition, Int. Conf., 2nd, 1970, pp. 795–798.

Minagwa et al., "Epitaxial Growth of α–SiC From the Vapor Phase," Jap. J. Appl. Phys., vol. 10, No. 12, Dec. 1971, pp. 1680–1690.

Powell et al., "Epitaxial Growth of 6H SiC in the Temperature Range 1320–1390 °C," J. Appl. Phys., vol. 44, No. 11, Nov. 1973, pp. 5177–5178.

Will et al, "Improved Epitaxial Process for Fabricating Silicon Carbide Semiconductor Devices", Solid State Technol., Apr. 1975, vol. 18, No. 4, p. 70.

Wessels et al., "Epitaxial Growth of Silicon Carbide by Chemical Vapor Deposition", *Silicon Carbide*, 1974, pp. 25–32.

Harris et al., "Growth Characteristics of Alpha–Silicon Carbide I. Chemical Vapor Deposition", J. Electrochem. Soc., vol. 118, No. 2, Feb. 1971, pp. 335–337.

Harris et al., "Growth Characteristics of Alpha–Silicon Carbide II. Equilibrium Considerations", J. Electrochem. Soc., vol. 118, No. 2, Feb. 1971, pp. 338–340.

T. Ueda, H. Nishino and H. Matsunami, "Crystal Growth Of SiC By Step–Controlled Epitaxy", Journal Of Crystal Growth 104 (1990), pp. 695–700.

*Primary Examiner*—Mary Wilczewski

[57] ABSTRACT

A method for epitaxially growing a-axis α-SiC on an a-axis substrate is provided. A section is formed from the SiC crystal by making a pair of parallel cuts in the crystal. Each of these cuts is parallel to the c-axis of the crystal. The resulting section formed from the crystal has opposing a-face surfaces parallel to the c-axis of the crystal. A gas mixture having hydrocarbon and silane is passed over one of the a-face surfaces of the section. The hydrocarbon and silane react on this a-face surface to form an epitaxial layer of SiC. Preferably, the SiC is grown at a temperature of approximately 1450° C.

5 Claims, 5 Drawing Sheets

METHOD FOR EPITAXIALLY GROWING α-SILICON CARBIDE ON A-AXIS α-SILICON CARBIDE SUBSTRATES

The U.S. Government has a paid-up license in this invention and the right in limited circumstances to require the patent owner to license others on reasonable terms as provided for by the terms of contract No. N60530-92-C-0112 awarded by the Naval Air Warfare Center.

BACKGROUND OF THE INVENTION

1. Field of the Invention

The present invention relates to the field of silicon carbide and methods for growing crystals of silicon carbide and is more particularly related to a method for epitaxially growing silicon carbide layers on silicon carbide substrates.

2. Description of the Prior Art

Silicon carbide (SIC) is a semiconductor material which provides many advantages over other available materials. There are two classes of SiC: β-SiC with a cubic (zinc blend) crystal structure and α-SiC with hexagonal and rhombohedral crystal structures. There are numerous forms of α-SiC referred to as polytypes determined by the stacking sequence of double layers of Si and C atoms. Examples of the polytypes of α-SiC include 6H, 4H, 2H and 15R. 6H SiC is characterized by a 6 layer repeat distance and hexagonal crystal structure. α-SiC crystals have shown promising results for use in wide band gap semiconductors for high temperature and high power microelectronics applications. However, the growth of α-SiC bulk and epitaxial materials as well as subsequent device processing is at a relatively immature stage in comparison to silicon (Si) and gallium arsenide (GaAs) semiconductors.

The α-SiC crystal is shown in FIG. 1. In FIG. 1, crystal 10 is shown having three unique crystallographic axes. They are the c-axis (Miller indices <0001> 12 that is perpendicular to the hexagonal basal plane 14; the a-axis <1120> 16 which is parallel to the basal plane 14 and is directed to one of the six vertices 18 of crystal 10; and the prismatic axis <1100> 20 which is also parallel to the basal plane 14 and is directed to any one of the six sides 22 of crystal 10.

Traditionally, the face perpendicular to the c-axis <0001> 12 has been utilized in crystal growth. The earliest work in (6H) α-SiC relied on small SiC platelets grown by a sublimation process, known as the Lely process. These platelets, of several millimeters in lateral dimension, were oriented with the face perpendicular to the c-axis 12. More recently, SiC boule growth has also yielded c-axis oriented slices.

Examination of the crystal structure of 6H SiC (one of the α-SiC polytypes) grown along the c-axis 12 is shown in FIG. 2. FIG. 2 shows that the vertical layered structure 24 terminates on one face by carbon atoms 26 and on the other face by silicon atoms 28. It had been shown previously by numerous investigators that successful epitaxial growth of 6H SiC on c-axis material was a strong function of which face of the crystal was used and, importantly, the exact number of degrees the exposed nominal c-axis surface is off-oriented from the c-axis basal plane 30. This strong orientation dependence is thought to be due to the characteristic pattern of steps and terraces that results from various off-orientations from c-axis 12. FIG. 3 illustrates the steps and terraces resulting from polishing an α-SiC crystal a few degrees off the c-axis 12.

In U.S. Pat. No. 3,956,032, a method is described for growing SiC layers on SiC substrates utilizing an axis transverse to the c-axis. In one embodiment of that method, sections cut from a 6H SiC platelet have opposing a-faces which are parallel to the c-axis of the platelet. The sections serve as substrates for the growth of SiC layers by attaching the substrates to a body which is then placed in a chamber and the chamber evacuated. Hydrogen is then admitted and the body on which the substrates are mounted is heated to produce a temperature profile such that the subsequent admission of a carbon containing chlorosilane gas or a mixture of a chlorosilane gas in a hydrocarbon gas will cause free silicon to be deposited at one end of the body while SiC crystals grow on the substrates which are in a preferred temperature range. The epitaxial growth of the SiC crystals on the transverse axis is achieved in that region of the susceptor having a temperature profile between 1320° C. and 1390° C.

The epitaxial growth method of U.S. Pat. No. 3,956,032 failed to specify the use of the transverse a-axis and failed to specify the a-axis or prismatic orientation of the transverse material. Moreover, the a-axis epitaxial growth method disclosed in U.S. Pat. No. 3,956032 failed to produce a smooth morphology. That growth method produced epitaxial wafers too small for subsequent device processing and too small even for electrical characterization. Accordingly, there is a need for an improved method for epitaxially growing 6H-SiC on the a-axis.

SUMMARY OF THE INVENTION

Inspection of the crystal structure of the α-SiC shown in FIG. 2 shows that the layered structure of an α-SiC polytype is more ideally revealed transverse to the c-axis <0001> 12. There are two nonequivalent crystal directions in this transverse direction. They are the a-axis <1120> 16 and prismatic axis <1100> 20 shown in FIG. 1. Transverse SiC is also an attractive crystal orientation from a device physics perspective as it provides a different breakdown behavior from the conventional c-axis 12 material namely, hole and electron avalanche breakdown coefficients within a factor of 5 of one another as opposed to greater than 100.

A method for epitaxially growing silicon carbide on a substrate is provided in which an α-SiC substrate having a nominally a-axis orientation (i.e., a-axis nominally perpendicular to the substrate face) is used. Examples of α-SiC substrates that can be used include the 6H, 4H, 2H and 15R polytypes. A-axis oriented substrates are formed by making a pair of parallel cuts in a bulk SiC crystalline boule, each cut being parallel to the c-axis direction and perpendicular to a single a-axis direction. The bulk SiC boule may be grown in the c-axis direction in which case the a-axis substrate surfaces are parallel to the bulk growth direction. Alternatively, the bulk SiC boule may be grown in the a-axis direction in which case the a-axis substrate surfaces are perpendicular to the bulk growth direction.

The SiC epitaxial layer is grown by passing a gas mixture comprised of a hydrocarbon and a silane. Distinct from U.S. Pat. No. 3,956,032, a chlorosilane gas is not employed. Rather, silane, which is free of any halogen compounds, is employed. The gas mixture is passed over one of the opposing a-face surfaces of the substrate. The hydrocarbon and silane react on the substrate to form an epitaxial layer of SiC. Preferably the SiC layer is grown at a temperature of approximately 1450° C.

DETAILED DESCRIPTION OF THE PREFERRED EMBODIMENTS

Figure 1:
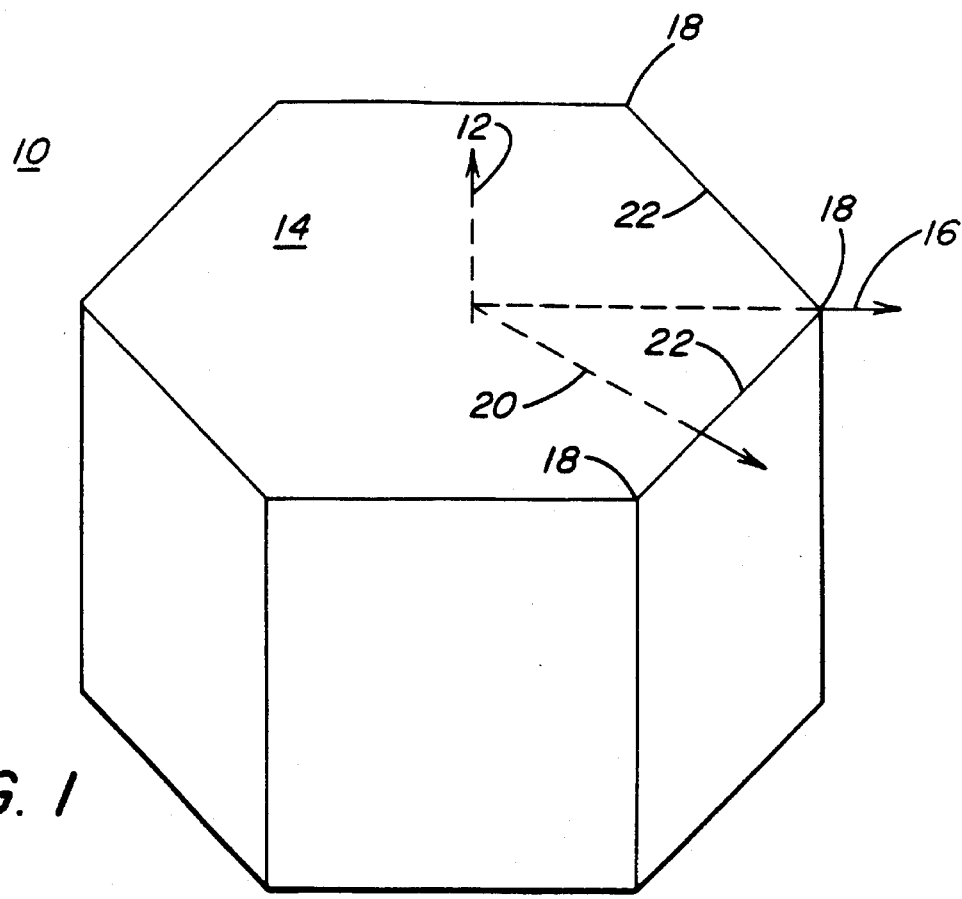
FIG. 1 is a schematic drawing illustrating a 6H SiC crystal.
Figure 2:
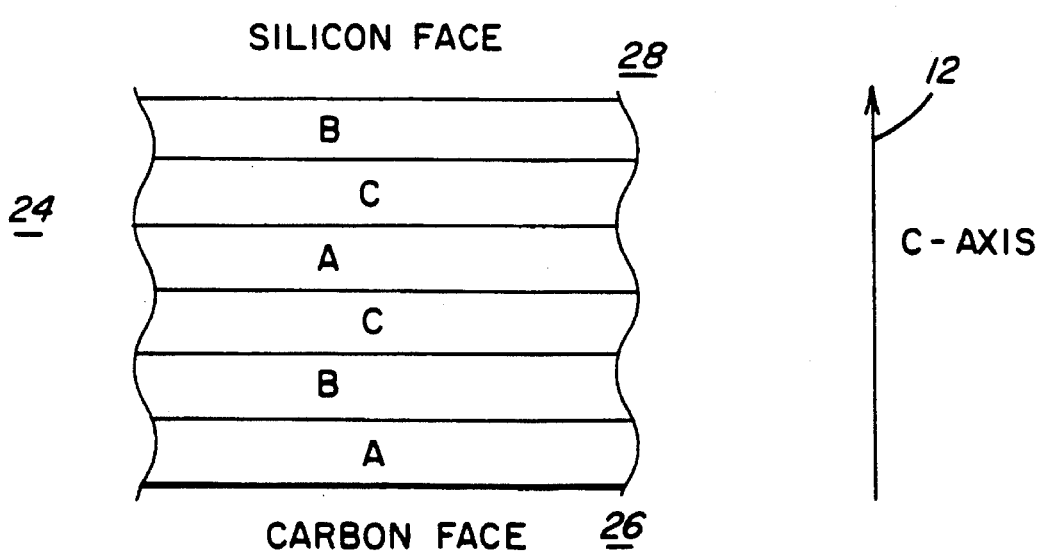
FIG. 2 is a schematic drawing representing the layered structure of the 6H SiC crystal of FIG. 1.
Figure 3:
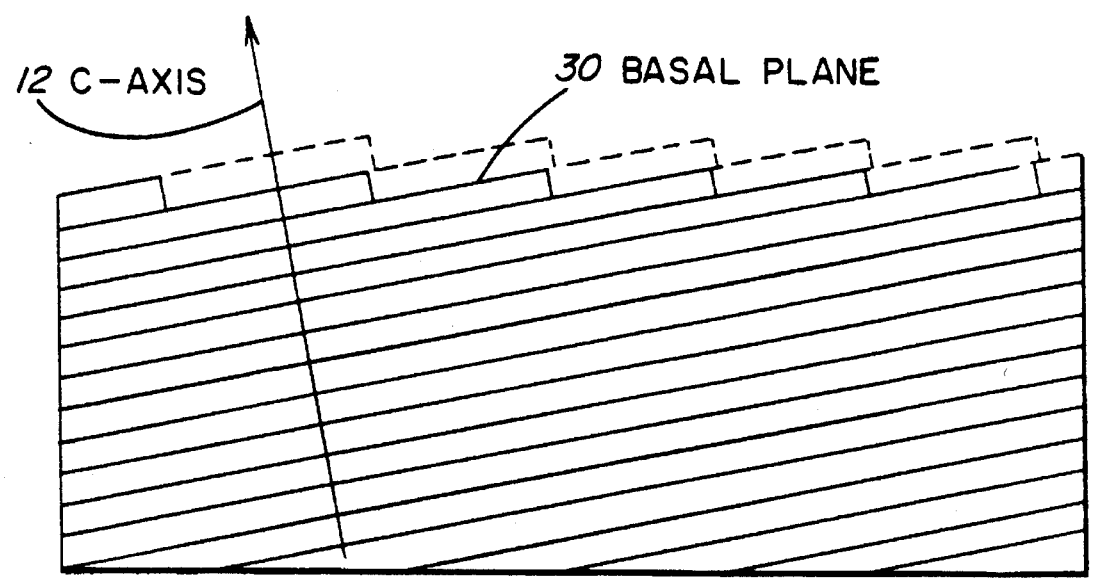
FIG. 3 is a schematic drawing illustrating the terraced growth on an off-oriented c-axis α-SiC crystal structure.
Figure 4:
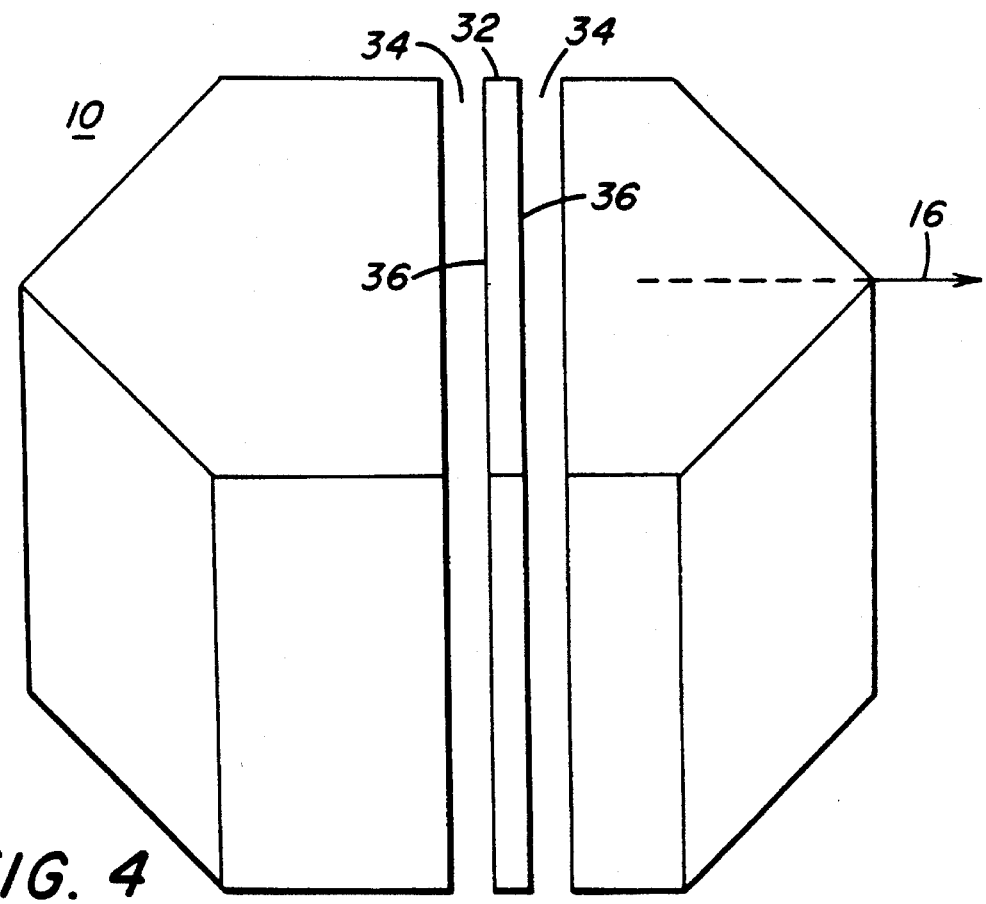
FIG. 4 is a schematic drawing illustrating a method for producing an a-axis α-SiC substrate as used in the present invention.
Figure 5:
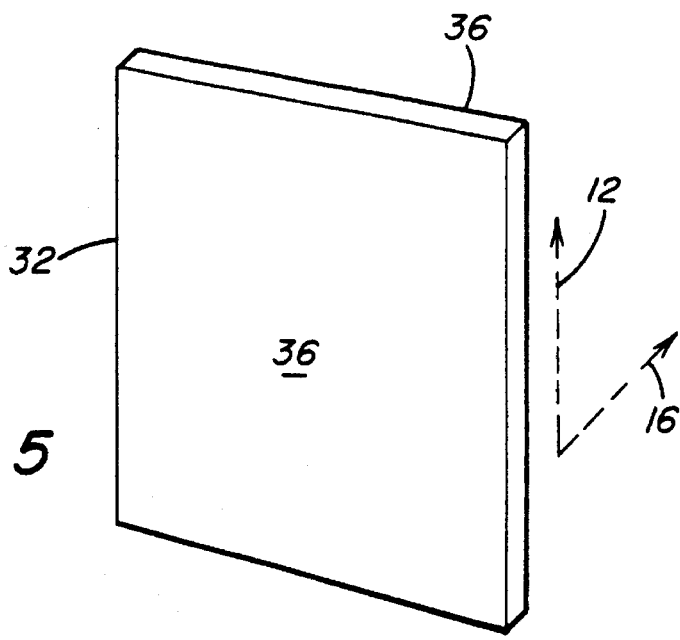
FIG. 5 is a schematic drawing illustrating the a-axis α-SiC substrate formed in accordance with the present invention.

A method for epitaxially growing a-axis silicon carbide on an a-axis substrate is provided. As shown in FIG. 4, sections 32 of SiC crystal 10 are formed by making a pair of parallel cuts 34 in the crystal 10. Each cut 34 is parallel to the c-axis 12 of the crystal 10 and perpendicular to the a-axis 16 of crystal 10. As shown in FIG. 5, the resulting section 32 has opposing a-face surfaces 36 parallel to the c-axis 12 of the crystal 10 and perpendicular to the a-axis 16.

Section 32 forms a substrate upon which the α-SiC layer is epitaxially grown. The SiC epitaxial layer is grown by passing a gas mixture comprised of a hydrocarbon and silane over one of the opposing a-face surfaces 36. A hydrogen carrier is preferably used. Other silane-based gases free of any halogen compound may be used in the gas mixture. Preferably, the hydrocarbon gas used in the mixture is propane. The hydrocarbon and silane react on the a-face surface 36 of substrate 32 to form an epitaxial layer of SiC. Preferably, the SiC layer is grown at a temperature of approximately 1450° C.

The performance of the material formed in accordance with the present invention was tested by comparing growth of SiC on the a-axis, prismatic axis and c-axis. Nominally a-axis and prismatic oriented materials were placed in a SiC chemical vapor deposition (CVD) reactor along with c-axis substrates which were off-oriented 3°. A series of growth runs were performed using silane and propane as reagents with hydrogen as a carrier gas.

Three epitaxial layers were grown simultaneously on the a-axis, prismatic axis and c-axis, under conditions sufficiently off the optimum that the c-face morphology was no longer specular. The a-face morphology however was always superior to that on the c-face. In contrast, specular epitaxial surfaces on the prismatic face have not been able to be achieved under any conditions. Although minor differences in morphology are expected from growth on the a-axis and prismatic axis, the results obtained from these experiments are not suggested from the prior art.

Figure 6:
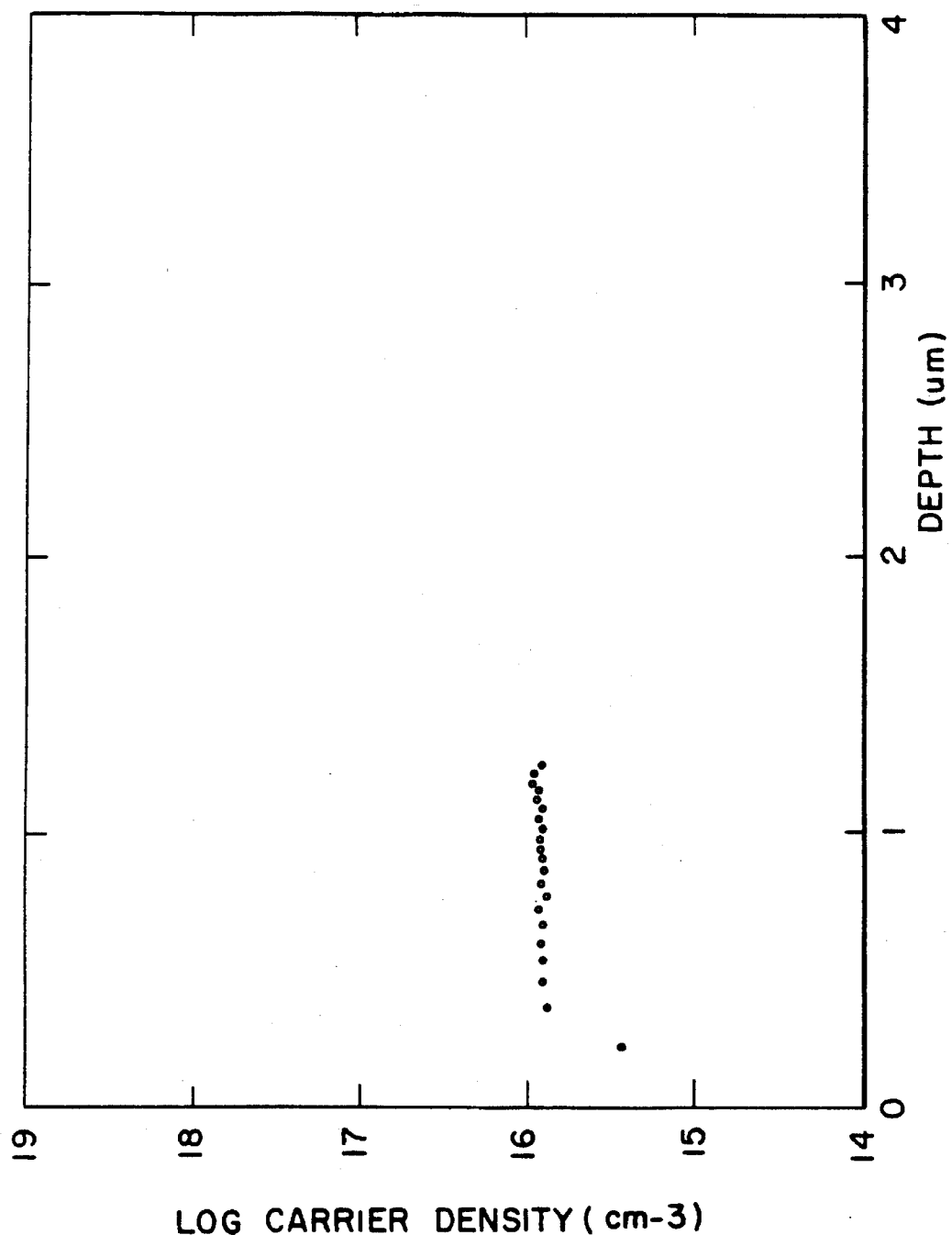
FIG. 6 is a graph showing C-V measurements on unintentionally doped a-axis epitaxial layers.

It was repeatedly observed in these growth runs that the a-axis material had smooth morphology regardless of the temperature of an in situ HCl etch and was devoid of the defects that have been observed in c-axis epitaxial growth. In contrast, more vigorous etching conditions including increased time, temperature and HCl concentrations yields very rough, faceted c-axis surfaces. The exact number of degrees off orientation and the direction of orientation also dramatically impact epitaxial layer morphology on the c-axis material. The excellent purity of the a-axis epitaxial SiC material is shown in FIG. 6 FIG. 6 shows low background doping density of less than $1 \times 10^{16}$ cm$^{-3}$ for the a-axis epitaxial SiC material.

In contrast to the superior epitaxial growth characteristics on transverse a-axis substrates, epitaxial growths on prismatic substrates resulted in highly defective growth with numerous elongated features running along the a-axis direction. Additionally, these layers typically suffered from high n-type background doping levels of approximately $1 \times 10^{18}$ cm$^{-3}$.

The major defect associated with a-axis epitaxy is associated with the intersection of micropores with the surface. These micropores are characteristic of c-axis bulk growth. Since these micropores lie essentially on the c-axis, relatively few pores intersect the surface and the layers are still suitable for device fabrication. Micropores are almost totally absent in a-axis grown crystals so even those defects are absent when a-axis epitaxy is performed on a-axis wafers cut from a-axis grown crystals.

Figure 7:
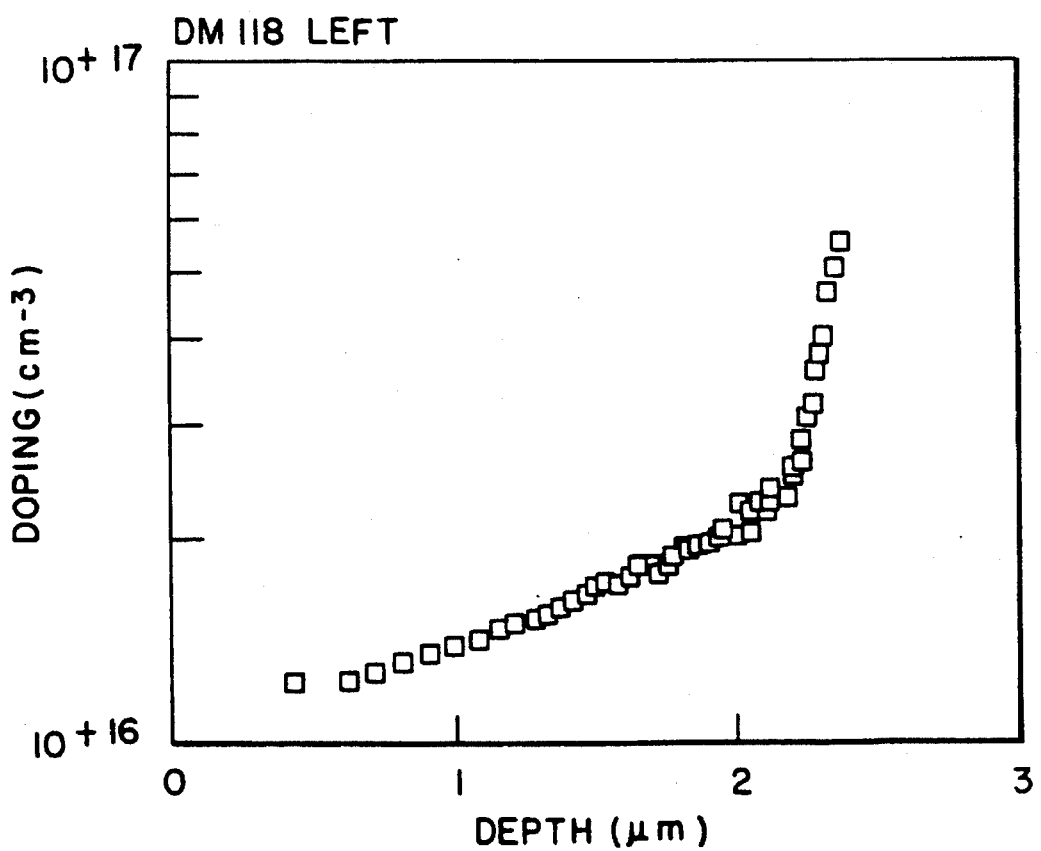
FIG. 7 is a graph showing the C-V profile of an a-axis epitaxial layer grown in accordance with the present invention.

Controlled nitrogen n-type doping has been demonstrated by the a-axis epitaxy with electron concentrations as high as $1 \times 10^{19}$ cm$^{-3}$ and as low as $1 \times 10^{16}$ cm$^{-3}$ and with uniform consistent growth rates. FIG. 7 shows the C-V profile of an epitaxial layer grown for IMPATT devices. The target layer specification was $2 \times 10^{16}$ cm$^{-3}$ by 2.5 micron on the n$^+$ substrate. The C-V analysis shows the correct layer structure was obtained with a clean interface with the substrate.

Figure 8:
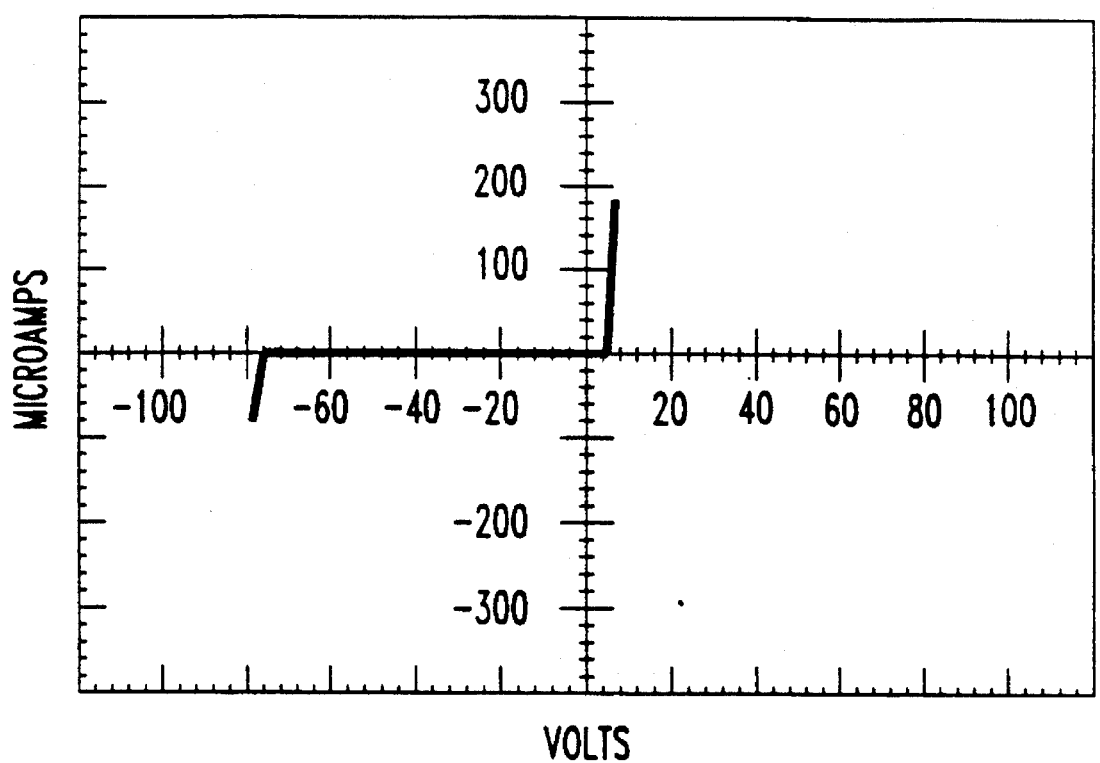
FIG. 8 is a graph showing the I-V characteristics of an a-axis epitaxial layer grown in accordance with the present invention.

Thicker forms of the epitaxial layers were employed to obtain the a-axis breakdown data shown previously. FIG. 8 shows the I-V characteristics and hard breakdown of thick $5 \times 10^{17}$ cm$^{-3}$ layer. Although layers doped to $2.5 \times 10^{16}$ cm$^{-3}$ reach a 300 volt breakdown value, many of the contacts develop lower voltage microplasma breakdown after the initial breakdown despite the guard ring contact.

A-axis substrates have been shown to yield device quality epitaxial layers comparable to the best obtained on c-axis substrates. The doped and unintentionally doped carrier concentrations of a-axis epitaxial layers are systematically shifted in the n-type direction from that of the c-axis oriented controls. Epitaxial layer morphology on a-axis substrates has been found to be much less sensitive to growth conditions than that of c-axis substrates whereas epitaxial growth on nominally prismatic oriented substrates to date have been hypersensitive to substrate surface imperfections and have undesirably high background doping densities. It is believed that the orientation dependence of epitaxial layer morphology observed in SiC is consistent with preferred epitaxial growth along the a-axis direction in α-SiC.

A superior α-SiC epitaxial growth process has been demonstrated employing nominally a-axis, (6H) α-SiC substrates. This process is less sensitive to both in situ etching conditions and precise substrate orientation resulting in robust low background n-type doping levels and smooth layer morphology. It is anticipated that this improved process will result in increased performance and yields of α-SiC base devices.

In the foregoing specification certain preferred practices and embodiments of this invention have been set out, however, it will be understood that the invention may be otherwise embodied within the scope of the following claims.

We claim:

1. A method for epitaxially growing SiC on a substrate comprising the steps of:

a. providing an α-SiC crystal substrate;

b. forming a section from said crystal substrate by making a pair of cuts in said crystal substrate parallel to the c-axis of said crystal substrate, said section having opposing a-face surfaces parallel to the c-axis of said crystal;

c. passing a gas mixture comprised of a hydrocarbon and a silane-based compound free of any halogen over one of said opposing a-face surfaces of said section, said hydrocarbon and said silane reacting to form an epitaxial layer of SiC.

2. The method of claim 1 wherein said α-SiC crystal is the 6H polytype.

3. The method of claim 1 wherein said, hydrocarbon gas is propane.

4. The method of claim 3 wherein said silane-based compound is silane.

5. The method of claim 4 wherein said epitaxial layer of SiC is grown at a temperature of approximately 1450° C.

* * * * *